US010680565B2

(12) United States Patent
Scott et al.

(10) Patent No.: US 10,680,565 B2
(45) Date of Patent: Jun. 9, 2020

(54) POWER AMPLIFIER SYSTEM

(71) Applicant: Qorvo US, Inc., Greensboro, NC (US)

(72) Inventors: Baker Scott, San Jose, CA (US);
Hideya Oshima, Santa Clara, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 43 days.

(21) Appl. No.: 16/022,816

(22) Filed: Jun. 29, 2018

(65) Prior Publication Data
US 2020/0007097 A1    Jan. 2, 2020

(51) Int. Cl.
| H03F 3/04 | (2006.01) |
| H03F 3/21 | (2006.01) |
| H03F 1/02 | (2006.01) |
| H03F 3/19 | (2006.01) |
| H03F 1/30 | (2006.01) |
| H03F 3/24 | (2006.01) |

(52) U.S. Cl.
CPC .......... H03F 3/211 (2013.01); H03F 1/0205 (2013.01); H03F 1/302 (2013.01); H03F 3/19 (2013.01); H03F 3/245 (2013.01); *H03F 2200/18* (2013.01); *H03F 2200/432* (2013.01); *H03F 2200/451* (2013.01)

(58) Field of Classification Search
CPC . H03F 3/211; H03F 3/245; H03F 3/19; H03F 1/0205; H03F 1/302; H03F 2200/432; H03F 2200/18; H03F 2200/451; H03F 1/301

USPC .................................. 330/250, 285, 296
See application file for complete search history.

(56) References Cited

U.S. PATENT DOCUMENTS

| 7,439,808 | B2 * | 10/2008 | Inamori | ..................... H03F 1/30 |
| | | | | 330/289 |
| 7,936,219 | B2 * | 5/2011 | Matsuzuka | ........... H03F 1/0261 |
| | | | | 330/285 |
| 9,337,787 | B2 * | 5/2016 | Schooley | .................. H03F 3/21 |
| 9,768,738 | B2 * | 9/2017 | Honda | ...................... H03F 1/32 |
| 9,887,669 | B2 * | 2/2018 | Shi | ............................ H03F 1/56 |
| 10,171,036 | B2 * | 1/2019 | Tanaka | .................. H03F 1/0205 |
| 2014/0285268 | A1 * | 9/2014 | Tsutsui | ...................... H03F 1/32 |
| | | | | 330/296 |
| 2018/0287560 | A1 * | 10/2018 | Choi | ........................ G05F 3/26 |
| 2018/0342992 | A1 * | 11/2018 | Sato | ....................... H03F 3/213 |

* cited by examiner

*Primary Examiner* — Khanh V Nguyen
(74) *Attorney, Agent, or Firm* — Withrow & Terranova, P.L.L.C.

(57) ABSTRACT

A power amplifier system is disclosed. The power amplifier system includes a power amplifier having a first signal input and a first signal output and a main bias circuitry configured to provide a first portion of a first bias signal to the power amplifier through a first bias output coupled to the first signal input. Further included is peak bias circuitry that is configured to provide a second portion of the first bias signal to the power amplifier through a second bias output coupled to the first signal input, wherein the first portion of the first bias signal is greater than the second portion of the first bias signal over a first input power range and the second portion of the first bias signal is greater than the first portion of the first bias signal over a second input power range that is greater than the first input power range.

20 Claims, 7 Drawing Sheets

POWER AMPLIFIER SYSTEM

FIELD OF THE DISCLOSURE

The disclosure relates generally to power amplifier systems of radio frequency transmitters and in particular to power amplifier systems that provide bias signals for amplifiers over a wide range of input power level.

BACKGROUND

A power amplifier is used to amplify radio frequency signals to be transmitted from an antenna of a wireless device such as a mobile telephone. A number of conventional power amplifiers employ bias circuitry that provides an inadequate bias signal level when the radio frequency signals reach a peak power level. As such, these conventional power amplifiers often suffer from output signal distortion at peak power levels. For example, the inadequate bias signal level results in amplitude modulation-amplitude modulation distortion that can cause an out-of-specification adjacent channel leakage ratio. Thus, a power amplifier system having a bias circuitry that provides adequate bias signal levels at all power levels is needed.

SUMMARY

A power amplifier system is disclosed. The power amplifier system includes a power amplifier having a first signal input and a first signal output and a main bias circuitry configured to provide a first portion of a first bias signal to the power amplifier through a first bias output coupled to the first signal input. Further included is a peak bias circuitry that is configured to provide a second portion of the first bias signal to the power amplifier through a second bias output coupled to the first signal input, wherein the first portion of the first bias signal is greater than the second portion of the first bias signal over a first input power range, and the second portion of the first bias signal is greater than the first portion of the first bias signal over a second input power range that is greater than the first input power range.

In some exemplary embodiments, the power amplifier is configured to operate as a single-ended power amplifier having only the first signal input and the first signal output, and in other exemplary embodiments the power amplifier is configured to operate as a differential power amplifier that includes a second signal input and a second signal output. In the latter case, the main bias circuitry is further configured to provide a first portion of a second bias signal through a third bias output coupled to a second signal input, and the peak bias circuitry is further configured to provide a second portion of the second bias signal through a fourth bias output coupled to the second input such that the first portion of the second bias signal is greater than the second portion of the second bias signal over a first input power range, and the second portion of the second bias signal is greater than the first portion of the second bias signal over a second input power range that is greater than the first input power range. In both cases, in some exemplary embodiments, the first power input range and the second input power range make up a total input power range, and the first input power range spans a greater portion of the total input power range than the second input power range.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4 is replaced with coupling capacitors.

DETAILED DESCRIPTION

Figure 1:
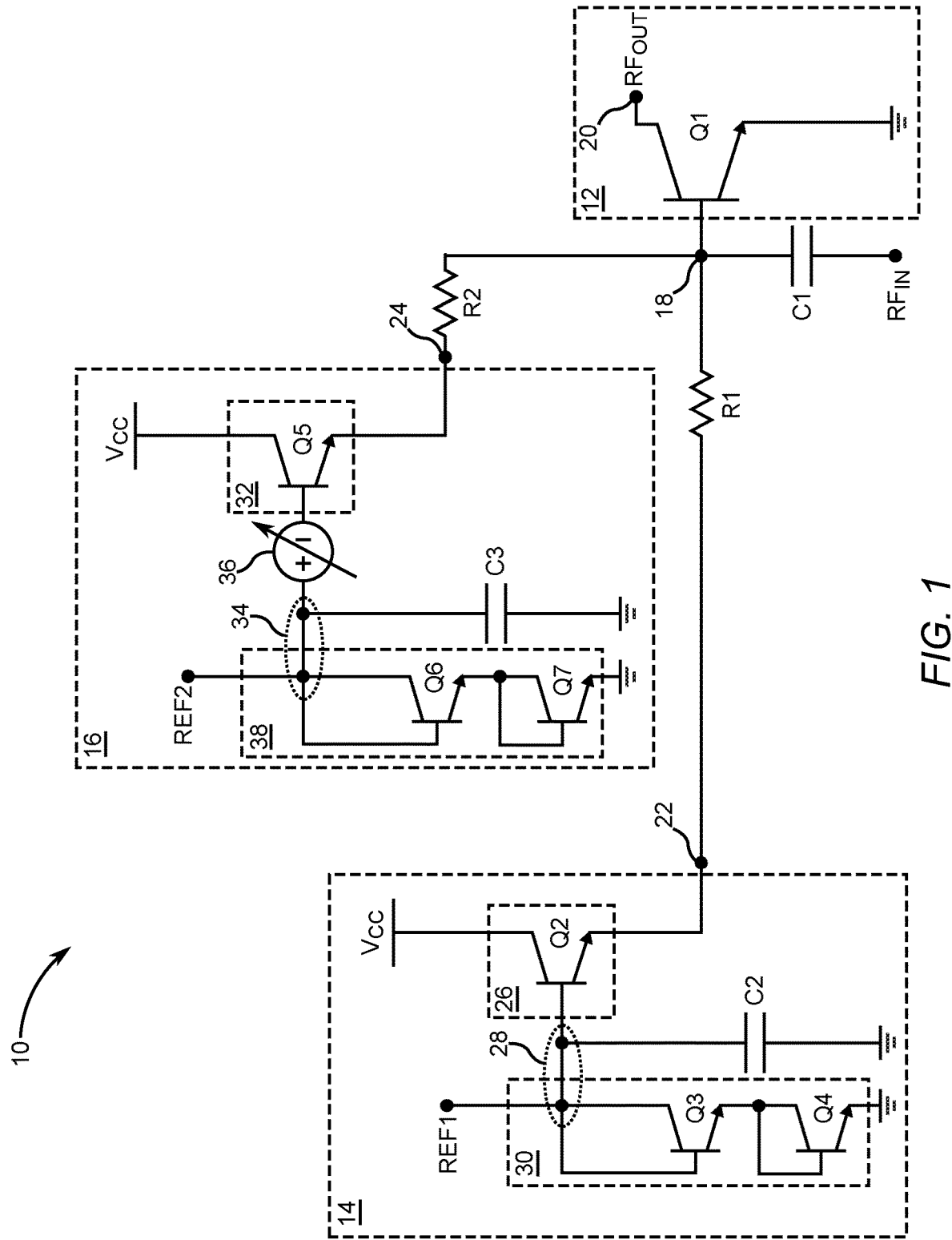
FIG. 1 is a schematic of an embodiment of a power amplifier system that includes a power amplifier, main bias circuitry, and peak bias circuitry that are configured to bias the amplifier for single-ended operation in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, with regard to a bipolar junction transistor, a base is a control terminal, a collector is a first current terminal, and an emitter is a second current terminal, wherein current injected into the base controls a flow of current through the collector and the emitter.

FIG. 1 is a schematic of an exemplary embodiment of a power amplifier system 10 that includes a power amplifier 12, main bias circuitry 14, and peak bias circuitry 16 that are configured to bias the power amplifier 12 for single-ended operation in accordance with the present disclosure. In the exemplary embodiment of FIG. 1, the power amplifier 12 is represented as a single bipolar junction transistor (BJT) Q1, however, it is to be understood that the power amplifier 12 can include additional transistors to provide increased gain. Further still, the power amplifier 12 is not limited to a particular amplifier technology.

The power amplifier 12 has a first signal input 18 and a first signal output 20. The main bias circuitry 14 is configured to provide a first portion of a first bias signal to the power amplifier 12 through a first bias output 22 coupled to the first signal input 18 through a first resistor R1. The peak bias circuitry 16 is configured to provide a second portion of the first bias signal to the power amplifier 12 through a second bias output 24 coupled to the first signal input 18 through a second resistor R2. However, it is to be understood that in some embodiments the first resistor R1 and the second resistor R2 may be eliminated by coupling the first bias output 22 and the second bias output 24 directly to the first signal input 18. Moreover, in some embodiments, the first resistor R1 and the second resistor R2 may be replaced with inductors.

Figure 2:
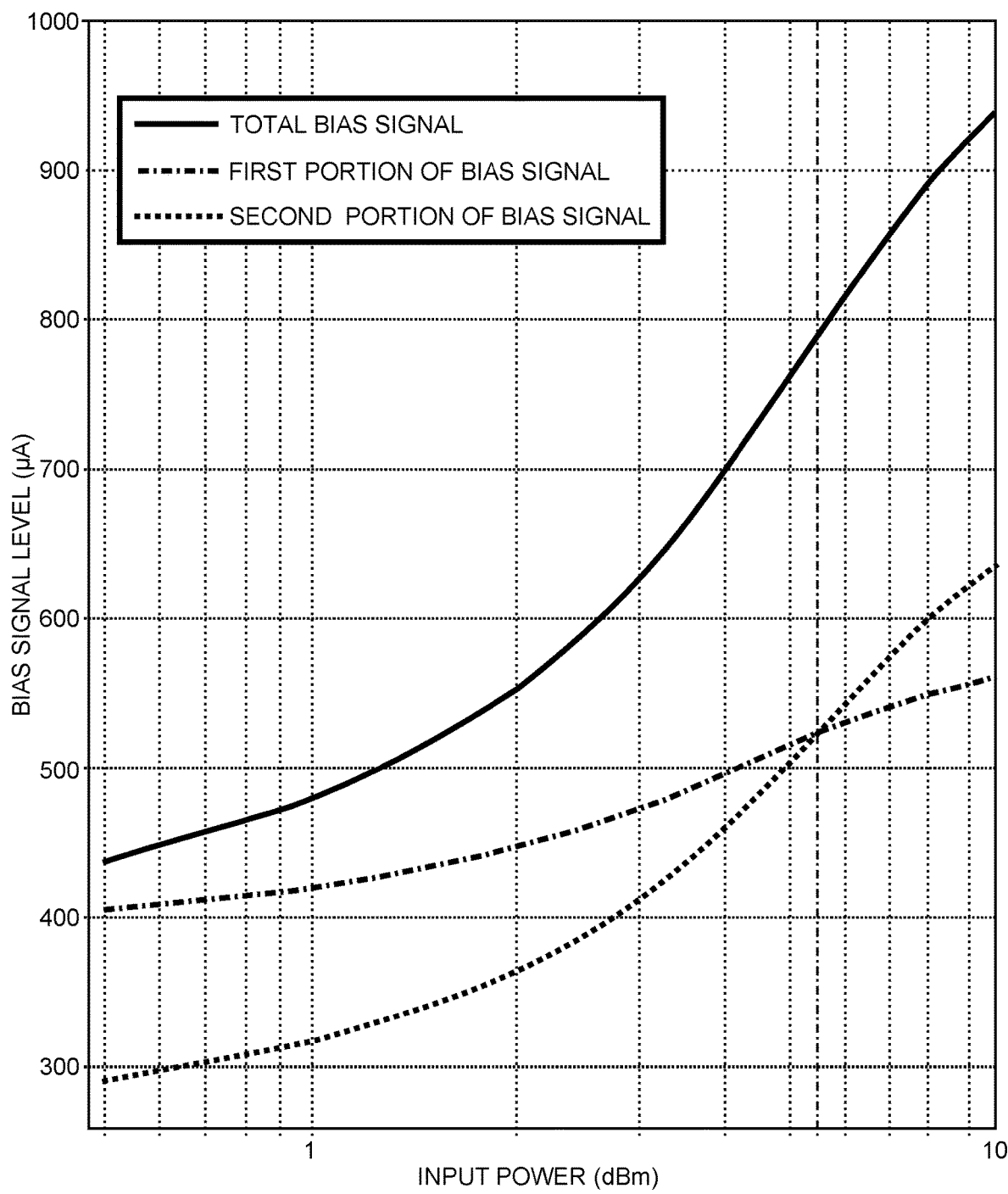
FIG. 2 is a graph depicting a first portion of a bias signal provided by the main bias circuitry and a second portion of the bias signal provided by the peak bias circuitry.

FIG. 2 is a graph illustrating the bias signal levels of the first bias signal depicted in thick solid line, the first portion of the first bias signal depicted in thick dot-dash line, and the second portion of the first bias signal depicted in thick short dash line. As shown in the graph of FIG. 2, the first portion of the first bias signal is greater than the second portion of the first bias signal over a first input power range that has power levels lower than a point at which the first portion of the first bias signal is equal to the second portion of the first bias signal. The point at which the first portion of the first bias signal and the second portion of the first bias signal are equal is indicated by a thin vertical dot-dash line within the graph of FIG. 2. The second portion of the first bias signal is greater than the first portion of the first bias signal over a second input power range that is greater than the first input power range that has power levels higher than the point at which the first portion of the first bias signal is equal to the second portion of the first bias signal. In the exemplary graph of FIG. 2, the first power input range and the second input power range make up a total input power range in which the first input power range spans a greater portion of the total input power range than does the second input power range.

Returning to FIG. 1, in this exemplary embodiment, a first capacitor C1 is coupled between a radio frequency (RF) signal input $RF_{IN}$ and the first signal input 18 for inputting an RF signal to be amplified into the power amplifier 12. Moreover, the main bias circuitry 14 includes a first bias generator 26, which in this case is a BJT Q2 that has a collector coupled to a power supply rail $V_{CC}$, a base coupled to a first bias reference node 28, and an emitter coupled to the first bias output 22. A first bias reference circuit 30 has a first reference supply input REF1 that is coupled to the first bias reference node 28. In this exemplary embodiment, the first bias reference circuit 30 is made up of a pair of stacked transistors Q3 and Q4 that are each in a diode configuration. A collector and a base of the transistor Q3 are coupled to the first bias reference node 28, while a collector and a base of the transistor Q4 are coupled to an emitter of Q3. An emitter of the transistor Q4 is coupled to a fixed voltage node, which in this case is ground. However, it is to be understood that a desired bias voltage and/or current can also be generated by replacing the pair of stacked transistors Q3 and Q4 with a single transistor, one or more diodes, or combinations thereof. One or more resistors can also be combined with the transistor(s) and/or diode(s) to more particularly refine the desired bias voltage and/or current at the first bias reference node 28. A second capacitor C2 is coupled between the first bias reference node 28 and the fixed voltage node, which in this exemplary embodiment is ground.

During operation, a first reference supply signal that follows input power level and/or output power level is applied to the first reference supply input REF1. The pair of stacked transistors Q3 and Q4 provides a first reference voltage that is filtered by the second capacitor C2. The first reference voltage controls the current level of the first portion of the first bias signal provided by the first bias generator 26 and emitted through the first bias output 22. In particular, the first reference voltage increases as input power level increases up until a point of saturation. In the particular embodiment of FIG. 1, the reference voltage drives a base current into the base of the BJT Q2, which in turn amplifies the base current to provide the first portion of the first bias signal emitted through the first bias output 22.

Staying with FIG. 1, the peak bias circuitry 16 includes a second bias generator 32, which in this case is a BJT Q5 that has a collector coupled to the power supply rail $V_{CC}$, a base communicatively coupled to a second bias reference node 34, and an emitter coupled to the second bias output 24. In the exemplary embodiment of FIG. 1, a bias offset generator 36 is coupled between the base of the BJT Q5 and the second bias reference node 34. The bias offset generator 36 provides a bias offset that sets the point at which the first portion of the first bias signal and the second portion of the first bias signal are equal. As such, the bias offset generator 36 establishes at what input power level the peak bias circuitry 16 provides a larger portion of the first bias signal than the main bias circuitry 14.

As shown in FIG. 1, the bias offset generator 36 is adjustable in at least some embodiments. In some embodiments, the bias offset generator 36 can be made up of one or more diodes, one or more transistors, a resistor network, or combinations thereof.

A second bias reference circuit 38 has a second reference supply input REF2 that is coupled to the second bias reference node 34. In this exemplary embodiment, the second bias reference circuit 38 is made up of a pair of stacked transistors Q6 and Q7 that are each in a diode configuration. A collector and a base of the transistor Q6 is coupled to the second bias reference node 34, while a collector and a base of the transistor Q7 is coupled to an emitter of Q6. An emitter of the transistor Q7 is coupled to a fixed voltage node, which in this case is ground. However, it is to be understood that a desired bias voltage and/or current can also be generated by replacing the pair of stacked transistors Q6 and Q7 with a single transistor, one or more diodes, or combinations thereof. One or more resistors can also be combined with the transistor(s) and/or diode(s) to more particularly refine the desired bias voltage and/or current at the second bias reference node 34. A third capacitor C3 is coupled between the second bias reference node 34 and the fixed voltage node, which in this exemplary embodiment is ground.

During operation, a second reference supply signal that follows input power level and/or output power level is applied to the second reference supply input REF2. The pair of stacked transistors Q6 and Q7 provides a second reference voltage that is filtered by the third capacitor C3. The second reference voltage along with the bias offset generator controls the current level of the second portion of the first bias signal provided by the second bias generator 32 that is emitted through the second bias output 24. In particular, the second reference voltage increases as input power level increases up until a point of saturation. In the particular embodiment of FIG. 1, the second reference voltage drives a base current into the base of the BJT Q5, which in turn amplifies the base current to provide the second portion of the first bias signal emitted through the second bias output 24.

Figure 3:
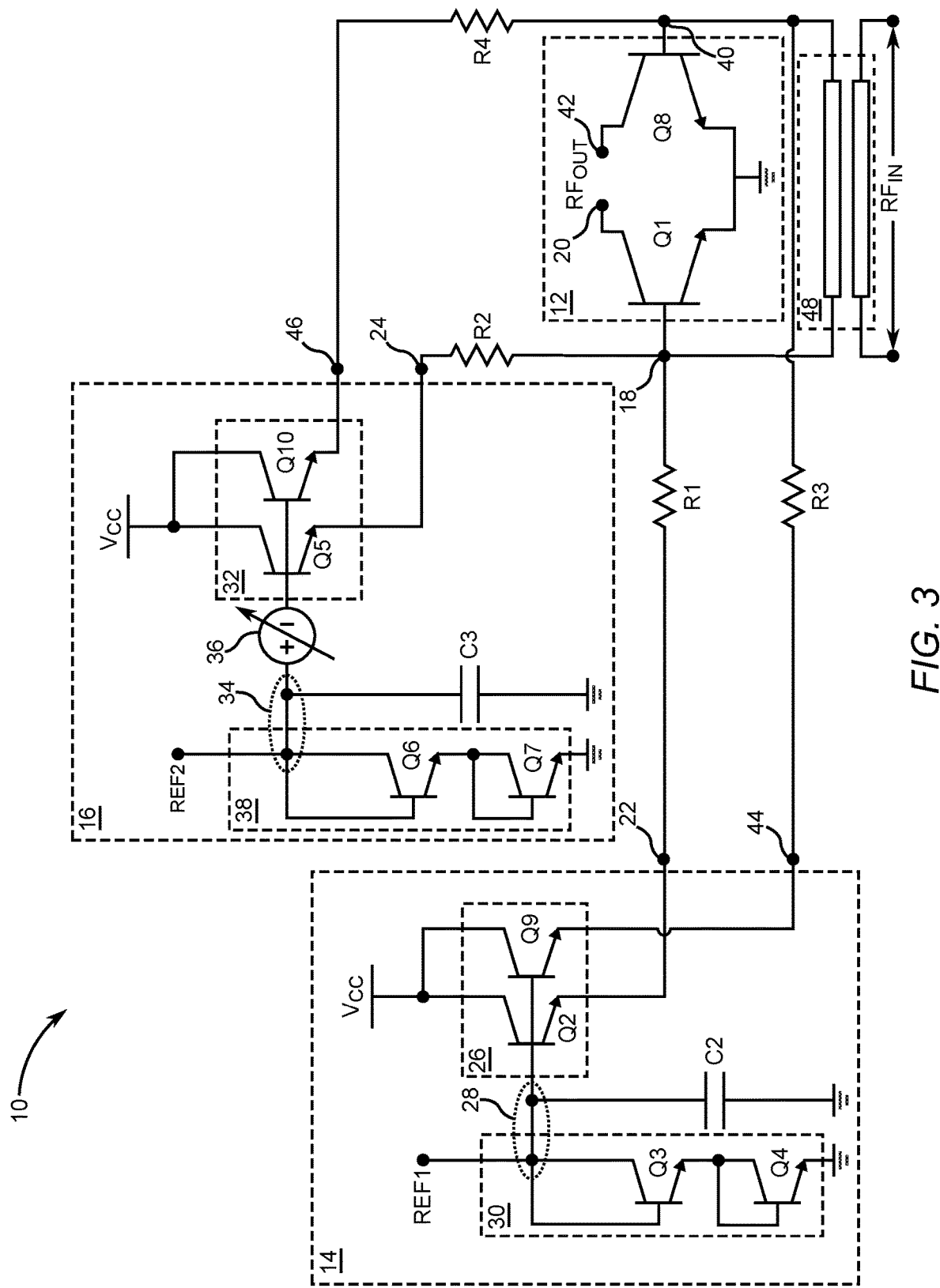
FIG. 3 is a schematic of an embodiment of the power amplifier system wherein the main bias circuitry and the peak bias circuitry are configured to bias the power amplifier for differential amplifier operation.

FIG. 3 is a schematic of an embodiment of the power amplifier system 10 wherein the main bias circuitry 14 and the peak bias circuitry 16 are configured to bias the power amplifier 12 for differential amplifier operation. In the exemplary embodiment of FIG. 3, the power amplifier 12 is configured as differential amplifier made up of the BJT Q1 and a BJT Q8; however, it is to be understood that the differential configuration of the power amplifier 12 can include additional transistors to provide increased gain. Further still, the power amplifier 12 is not limited to a particular amplifier technology.

In this exemplary embodiment, the power amplifier 12 includes a second signal input 40 and a second signal output 42. In this exemplary embodiment, the main bias circuitry 14 is further configured to provide a first portion of a second bias signal to the power amplifier 12 through a third bias output 44 coupled to the second signal input 40 through a third resistor R3. Moreover, the peak bias circuitry 16 is further configured to provide a second portion of the second bias signal to the power amplifier 12 through a fourth bias output 46 coupled to the second signal input 40 through a fourth resistor R4. However, it is to be understood that in some embodiments the third resistor R3 and the fourth resistor R4 may be eliminated by coupling the third bias output 44 and the fourth bias output 46 directly to the second signal input 40. Moreover, in some embodiments, the third resistor R3 and the fourth resistor R4 may be replaced with inductors.

Returning to FIG. 2, the graph also represents the bias signal levels of the second bias signal depicted in thick solid line, the first portion of the second bias signal depicted in thick dot-dash line, and a second portion of the second bias signal depicted in thick short dash line. As shown in the graph of FIG. 2, the first portion of the second bias signal is greater than the second portion of the second bias signal over the first input power range that has power levels lower than the point at which the first portion of the second bias signal is equal to the second portion of the second bias signal. The point at which the first portion of the second bias signal and the second portion of second bias signal are equal is indicated by the thin vertical dot-dash line within the graph of FIG. 2. The second portion of the second bias signal is greater than the first portion of the second bias signal over the second input power range that is greater than the first input power range that has power levels higher than the point at which the first portion of the second bias signal is equal to the second portion of the second bias signal. In the exemplary graph of FIG. 2, the first power input range and the second input power range make up a total input power range in which the first input power range spans a greater portion of the total input power range than the second input power range.

Returning to FIG. 3, in this exemplary embodiment, an RF coupler 48 is coupled between the first signal input 18 and the second signal input 40 for inputting an RF signal to be amplified into the power amplifier 12. Moreover, the first bias generator 26, in this exemplary embodiment further includes a BJT Q9 that has a collector coupled to a power supply rail $V_{CC}$, a base coupled to the first bias reference node 28, and an emitter coupled to the third bias output 44. Further still, the second bias generator 32 further includes a BJT Q10 that has a collector coupled to the power supply rail $V_{CC}$, a base coupled to the second bias reference node 34, and an emitter coupled to the fourth bias output 46.

During operation, the first reference supply signal that follows input power level and/or output power level is applied to the first reference supply input REF1. The pair of stacked transistors Q3 and Q4 provides the first reference voltage that is filtered by the second capacitor C2. The first reference voltage controls the current level of the first portion of the first bias signal provided by the first bias generator 26 and emitted through the first bias output 22. In particular, the first reference voltage increases as input power level increases up until a point of saturation. In the particular embodiment of FIG. 3, the first reference voltage drives a base current into the base of the second BJT Q2, which in turn amplifies the base current to provide the first portion of the first bias signal emitted through the first bias output 22. In addition, the first reference voltage drives the base current into the BJT Q9, which in turn amplifies the base current to provide the first portion of the second bias signal emitted through the third bias output 44.

Also during operation, the second reference supply signal that follows input power level and/or output power level is applied to the second reference supply input REF2. The pair of stacked transistors Q6 and Q7 provides the second reference voltage that is filtered by the third capacitor C3. The second reference voltage along with the bias offset generator 36 controls the current level of the second portion of the first bias signal provided by the second bias generator 32 that is emitted through the second bias output 24. In particular, the second reference voltage increases as input power level increases up until a point of saturation. In the particular embodiment of FIG. 3, the second reference voltage drives a base current into the base of the BJT Q5, which in turn amplifies the base current to provide the second portion of the first bias signal emitted through the second bias output 24. In addition, the second reference voltage drives a base current into the tenth BJT Q10, which in turn amplifies the base current to provide the second portion of the second bias signal emitted through the fourth bias output 46.

Figure 4:
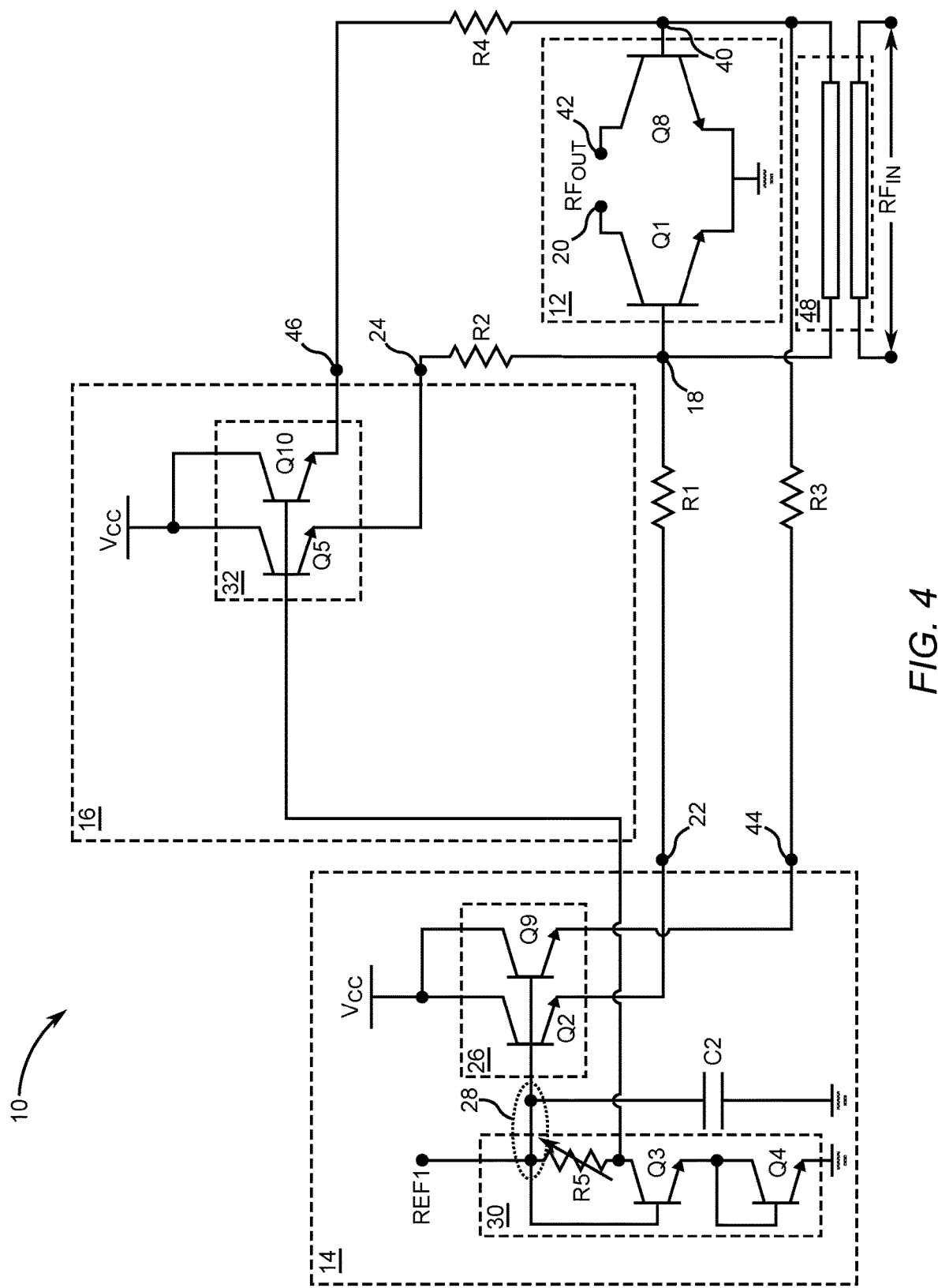
FIG. 4 is a schematic of a modified version of the embodiment of FIG. 3 in which a bias offset for the peak bias circuitry is provided by a first bias reference circuit included in the main bias circuitry.

FIG. 4 is a schematic of a modified version of the embodiment of FIG. 3 in which the bias offset for the peak bias circuitry 16 is provided by the first bias reference circuit 30. In this exemplary embodiment, the bias offset generator 36, the third capacitor C3, and the second bias reference circuit 38 of the embodiment of FIG. 3 has been eliminated. In place of these eliminated elements, the base of the fifth BJT Q5 and the base of the tenth BJT Q10 are both coupled to the collector of the third transistor Q3 of the first bias reference circuit 30 that is within the main bias circuitry 14. In this embodiment, a fifth resistor R5 is coupled between the collector of the third BJT Q3 and the first bias reference node 28. During operation, a voltage drop caused by current flowing through the fifth resistor R5 sets the bias offset for the second bias generator 32. In the exemplary embodiment of FIG. 4, the fifth resistor R5 is a resistor having a variable resistance that allows for more fine adjustment of the bias offset. The fifth resistor R5 can be a field-effect transistor that is configured as a variable resistor.

Figure 5:
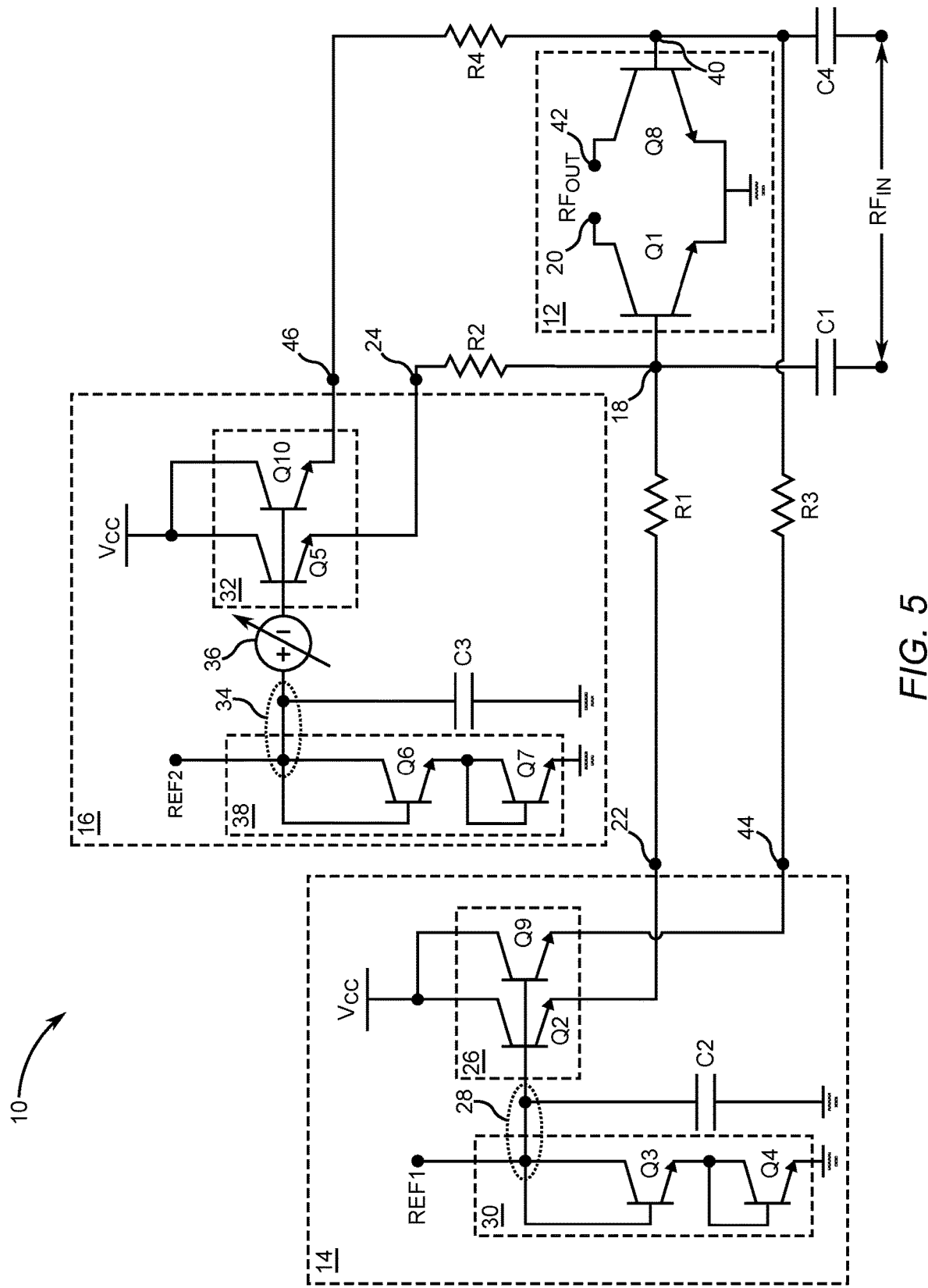
FIG. 5 is a schematic of a modified version of the embodiment of FIG. 3 in which a differential coupler depicted in FIG. 3

FIG. 5 is a schematic of a modified version of the embodiment of FIG. 3 in which a differential coupler, that is, RF coupler 48, depicted in FIG. 3 and FIG. 4 is replaced with coupling capacitors, the first capacitor C1 and a fourth capacitor C4. The first capacitor C1 couples an RF signal to be amplified to the first signal input 18, and the fourth capacitor C4 couples the RF signal to the second signal input 40.

Figure 6:
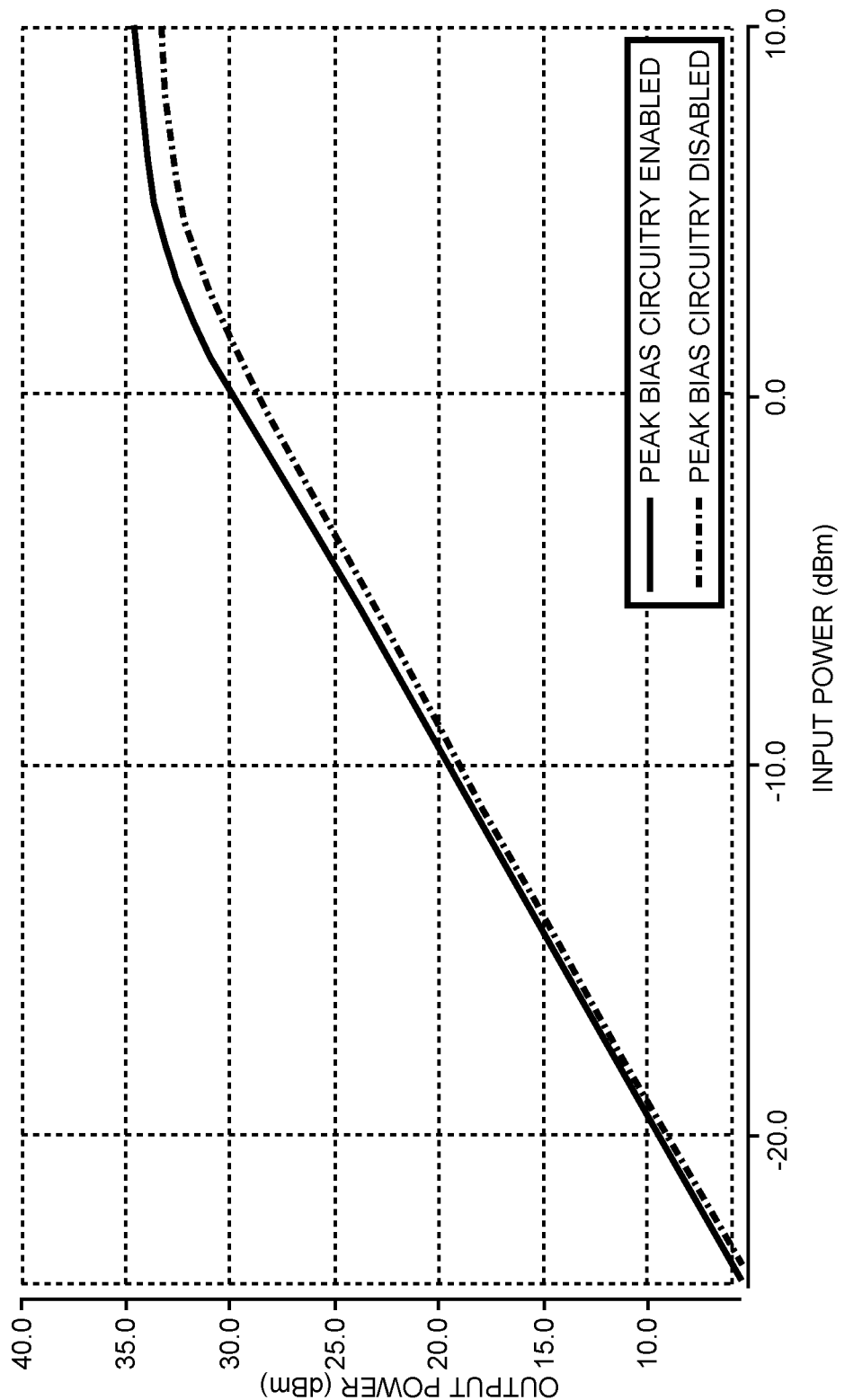
FIG. 6 is a graph of output power versus input power comparing increased saturated output power for the disclosed power amplifier system with the peak bias circuitry enabled versus with the peak bias circuitry disabled.

FIG. 6 is a graph of output power versus input power comparing increased saturated output power for the power amplifier system 10 with the peak bias circuitry 16 enabled versus with the peak bias circuitry 16 disabled. The main bias circuitry 14 is enabled continuously. Notice that there is at least a 1.25 dBm increase in saturated output power with an input power of 10 dBm.

Figure 7:
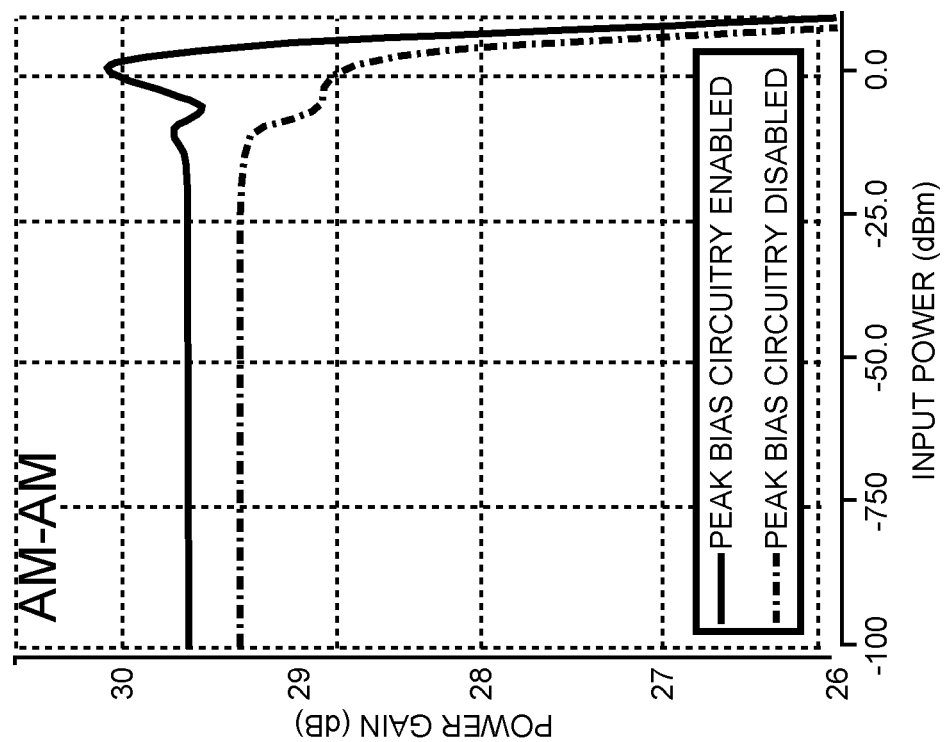
FIG. 7 is a graph of amplitude modulation-amplitude modulation (AM-AM) distortion versus input power comparing the disclosed power amplifier system with the peak bias circuitry enabled versus with the peak bias circuitry disabled.

FIG. 7 is a graph of amplitude modulation-amplitude modulation (AM-AM) distortion versus input power comparing the disclosed power amplifier system with the peak bias circuitry enabled versus with the peak bias circuitry disabled. The main bias circuitry 14 is enabled continuously. Notice that the gain with the peak bias circuitry 16 enabled is flatter for a larger span of input power that without the peak bias circuitry enabled.

Figure 8:
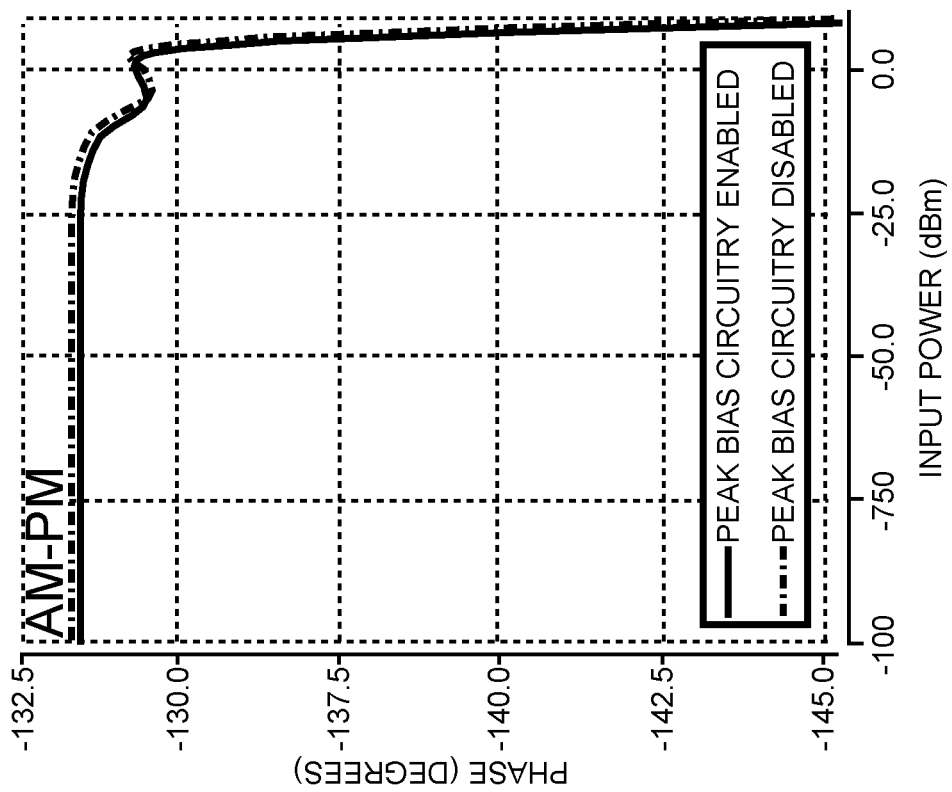
FIG. 8 is a graph of amplitude modulation-phase modulation (AM-PM) distortion versus input power comparing the disclosed power amplifier system with the peak bias circuitry enabled versus with the peak bias circuitry disabled.

FIG. 8 is a graph of amplitude modulation-phase modulation (AM-PM) distortion versus input power comparing the disclosed power amplifier system 10 with the peak bias circuitry 16 enabled versus with the peak bias circuitry 16 disabled. The main bias circuitry 14 is enabled continuously. Notice that there is no practical difference between the AM-PM distortion with or without the peak bias circuitry enabled.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
   a power amplifier having a first signal input and a first signal output;
   main bias circuitry configured to provide a first portion of a first bias signal to the power amplifier through a first bias output coupled to the first signal input; and
   peak bias circuitry configured to provide a second portion of the first bias signal to the power amplifier through a second bias output coupled to the first signal input, wherein the first portion of the first bias signal is greater than the second portion of the first bias signal over a first input power range, and the second portion of the first bias signal is greater than the first portion of the first bias signal over a second input power range that is greater than the first input power range.

2. The power amplifier system of claim 1 wherein the first input power range has lower power levels than the second input power range.

3. The power amplifier system of claim 1 wherein the first input power range and the second input power range comprise a total input power range, and the first input power range spans a greater portion of the total input power range than does the second input power range.

4. The power amplifier system of claim 1 wherein the power amplifier is configured to operate as a differential power amplifier that includes a second signal input and a second signal output.

5. The power amplifier system of claim 4 wherein the main bias circuitry is further configured to provide a first portion of a second bias signal through a third bias output coupled to the second signal input, and the peak bias circuitry is further configured to provide a second portion of the second bias signal through a fourth bias output coupled to the second signal input such that the first portion of the second bias signal is greater than the second portion of the second bias signal over the first input power range, and the second portion of the second bias signal is greater than the first portion of the second bias signal over the second input power range that is greater than the first input power range.

6. The power amplifier system of claim 5 wherein the main bias circuitry comprises:
- a first bias reference circuit configured to provide a first reference voltage to a first bias reference node; and
- a first bias generator comprising:
    - a first transistor having a first control terminal coupled to the first bias reference node, a first current terminal coupled to a power supply rail, and a second current terminal coupled to the first bias output; and
    - a second transistor having a second control terminal coupled to the first bias reference node, a third current terminal coupled to the power supply rail, and a fourth current terminal coupled to the second bias output.

7. The power amplifier system of claim 6 further including a first filter capacitor coupled between the first bias reference node and a fixed voltage node.

8. The power amplifier system of claim 6 wherein the first bias reference circuit is a pair of stacked transistors that are each in a diode configuration coupled between the first bias reference node and a fixed voltage node.

9. The power amplifier system of claim 8 wherein the pair of stacked transistors are bipolar junction transistors.

10. The power amplifier system of claim 6 wherein the first transistor of the first bias generator and the second transistor of the first bias generator are bipolar junction transistors.

11. The power amplifier system of claim 6 wherein the peak bias circuitry comprises:
- a second bias reference circuit configured to provide a second reference voltage to a second bias reference node; and
- a second bias generator comprising:
    - a third transistor having a third control terminal coupled to the second bias reference node, a fifth current terminal coupled to the power supply rail, and a sixth current terminal coupled to the third bias output; and
    - a fourth transistor having a fourth control terminal coupled to the second bias reference node, a seventh current terminal coupled to the power supply rail, and a fourth current terminal coupled to the fourth bias output.

12. The power amplifier system of claim 11 further including an offset bias generator coupled between the third control terminal and the second bias reference node, wherein the offset bias generator is configured to generate a bias offset that sets a first point at which the first portion of the first bias signal and the second portion of the first bias signal are equal.

13. The power amplifier system of claim 12 wherein the offset bias generator is coupled between the fourth control terminal and the second bias reference node, wherein the bias offset generated by the offset bias generator sets a second point at which the first portion of the second bias signal and the second portion of the second bias signal are equal.

14. The power amplifier system of claim 11 further including a second filter capacitor coupled between the second bias reference node and a fixed voltage node.

15. The power amplifier system of claim 11 wherein the second bias reference circuit is a pair of stacked transistors that are each in a diode configuration.

16. The power amplifier system of claim 15 wherein the pair of stacked transistors are bipolar junction transistors.

17. The power amplifier system of claim 11 wherein the third transistor of the second bias generator and the fourth transistor of the second bias generator are bipolar junction transistors.

18. The power amplifier system of claim 6 wherein the first bias reference circuit comprises:
- a first bipolar junction transistor having a first base coupled to the first bias reference node, a first collector, and a first emitter;
- a second bipolar junction transistor having a second base coupled to the first emitter, and a second collector coupled to the second base, and a second emitter coupled to a fixed voltage node; and
- a resistor coupled between the first bias reference node and the first collector.

19. The power amplifier system of claim 18 wherein the peak bias circuitry includes a second bias generator comprising:
- a third transistor having a third control terminal coupled to the first collector, a fifth current terminal coupled to the power supply rail, and a sixth current terminal coupled to the third bias output; and
- a fourth transistor having a fourth control terminal coupled to the first collector, a seventh current terminal coupled to the power supply rail, and a eighth current terminal coupled to the fourth bias output wherein a bias reference voltage at the first collector sets a bias offset for the second bias generator.

20. The power amplifier system of claim 18 wherein the resistor has a variable resistance for adjusting the bias reference voltage.

* * * * *